(12) United States Patent
Schmidhammer et al.

(10) Patent No.: US 9,590,163 B2
(45) Date of Patent: Mar. 7, 2017

(54) ELECTRONIC COMPONENT AND METHOD FOR PRODUCING THE ELECTRONIC COMPONENT

(75) Inventors: Edgar Schmidhammer, Stein An Der Traun (DE); Gudrun Henn, Ebenhausen (DE)

(73) Assignee: EPCOS AG, Munich (DE)

( * ) Notice: Subject to any disclaimer, the term of this patent is extended or adjusted under 35 U.S.C. 154(b) by 356 days.

(21) Appl. No.: 13/976,969

(22) PCT Filed: Nov. 22, 2011

(86) PCT No.: PCT/EP2011/070709
§ 371 (c)(1),
(2), (4) Date: Sep. 6, 2013

(87) PCT Pub. No.: WO2012/089416
PCT Pub. Date: Jul. 5, 2012

(65) Prior Publication Data
US 2013/0342079 A1      Dec. 26, 2013

(30) Foreign Application Priority Data
Dec. 30, 2010   (DE) .................. 10 2010 056 572

(51) Int. Cl.
| H03H 9/25 | (2006.01) |
| H01L 41/047 | (2006.01) |
| H03H 9/02 | (2006.01) |
| H01L 41/08 | (2006.01) |

(52) U.S. Cl.
CPC ........ *H01L 41/0478* (2013.01); *H01L 41/047* (2013.01); *H01L 41/0477* (2013.01); *H01L 41/08* (2013.01); *H03H 9/02* (2013.01)

(58) Field of Classification Search
USPC ..... 310/313 A, 313 B, 313 C, 313 D, 313 R, 310/320, 365; 333/186–188, 193–196
See application file for complete search history.

(56) References Cited

U.S. PATENT DOCUMENTS

| 4,028,648 A | 6/1977 | Hartmann et al. |
| 6,295,205 B1 | 9/2001 | Lang et al. |
| 6,818,464 B2 | 11/2004 | Heschel |
| 7,448,119 B2 | 11/2008 | Ozaki |
| 2003/0198021 A1 | 10/2003 | Freedman |

(Continued)

FOREIGN PATENT DOCUMENTS

| AT | WO2006133466 | * 12/2006 | ............. B60C 23/04 |
| DE | 4328794 A1 | 3/1995 | |

(Continued)

OTHER PUBLICATIONS

Bunch, J. Scott, et al., "Impermeable Atomic Membranes from Graphene Sheets," Nano Letters, ACS, US Jan. 1, 2008, vol. 8, No. 8, pp. 2458-2462.

(Continued)

*Primary Examiner* — Thomas Dougherty
(74) *Attorney, Agent, or Firm* — McDermott Will & Emery LLP

(57) ABSTRACT

The invention relates to an electronic component having a layer sequence, which comprises at least a first electrode (10), a second electrode (20) and an active region (30) and contains monoatomic carbon layers at least in sub-regions.

13 Claims, 9 Drawing Sheets

(56) References Cited

U.S. PATENT DOCUMENTS

Figure 1:
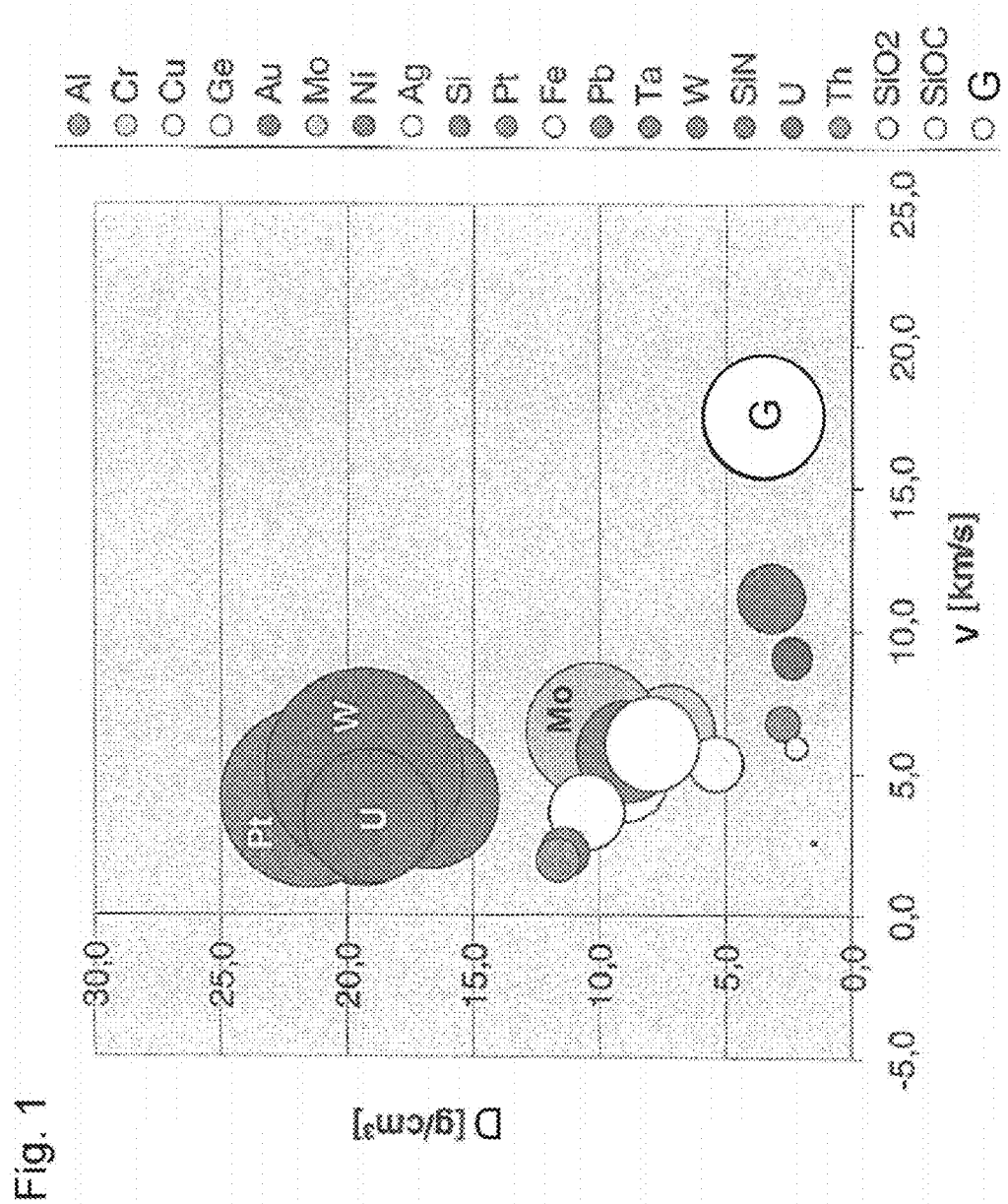

| | | |
|---|---|---|
| 2003/0210111 A1 | 11/2003 | Shin |
| 2005/0214974 A1 | 9/2005 | Field et al. |
| 2006/0210234 A1 | 9/2006 | Shiv |
| 2007/0035364 A1* | 2/2007 | Sridhar et al. ............... 333/191 |
| 2007/0056855 A1 | 3/2007 | Lo et al. |
| 2007/0188268 A1 | 8/2007 | Naito et al. |
| 2007/0278897 A1 | 12/2007 | Ozaki |
| 2008/0202657 A1 | 8/2008 | Hammel |
| 2009/0117386 A1 | 5/2009 | Vacanti et al. |
| 2009/0201102 A1 | 8/2009 | Oda |
| 2010/0084697 A1 | 4/2010 | Kopp et al. |
| 2010/0089636 A1 | 4/2010 | Ramadas et al. |
| 2010/0109486 A1 | 5/2010 | Polyakov et al. |
| 2010/0143726 A1 | 6/2010 | Golzhauser et al. |
| 2010/0171393 A1 | 7/2010 | Pei et al. |
| 2010/0218801 A1 | 9/2010 | Sung et al. |
| 2011/0133607 A1* | 6/2011 | Lee et al. ..................... 310/365 |
| 2012/0228993 A1* | 9/2012 | Colli ..................... H01L 41/113 310/313 R |
| 2012/0234559 A1* | 9/2012 | Howlett ............... E21B 17/05 166/381 |

FOREIGN PATENT DOCUMENTS

| | | | |
|---|---|---|---|
| DE | 19839422 A1 | 3/2000 | |
| DE | 10328373 A1 | 2/2005 | |
| DE | 102008001000 | * 10/2009 | ............. H03H 3/08 |
| DE | 102008001000 A1 | 10/2009 | |
| EP | 1646145 A1 | 4/2006 | |
| EP | 2436648 A1 | 4/2012 | |
| JP | 2002094356 A | 3/2002 | |
| JP | 2002290199 A | 10/2002 | |
| JP | 2005057707 A | 3/2005 | |
| JP | 2005137970 A | 6/2005 | |
| JP | 2005354651 A | 12/2005 | |
| JP | 2006121259 A | 5/2006 | |
| JP | 2007325013 A | 12/2007 | |
| JP | 2008210895 A | 9/2008 | |
| JP | 2010511267 A | 4/2010 | |
| JP | 2010141939 A | 6/2010 | |
| JP | 2010235401 A | 10/2010 | |
| WO | 2004114425 A1 | 12/2004 | |
| WO | 2005038907 A2 | 4/2005 | |
| WO | 2005099088 A1 | 10/2005 | |
| WO | 2006133466 A1 | 12/2006 | |
| WO | WO-2008057045 A1 | 5/2008 | |
| WO | WO-2009049375 A1 | 4/2009 | |
| WO | 2009121901 A1 | 10/2009 | |
| WO | WO-2010137592 A1 | 12/2010 | |

OTHER PUBLICATIONS

Dragoman M., et al., "High performance thin fim bulk acoustic resonator covered with carbon nanotubes," Applied Physics Letters, AIP, American Institute of Physics, Melville, NY, US, Issue No. 89., No. 14, Oct. 6, 2006, p. 143122.

Graham A. P. et al., "Towards the integration of carbon nanotubes in microelectronics," Diamond and Related Materials, Elsevier Science Publishers, Amsterdam, NL, Issue No. 13, No. 4-8, Apr. 1, 2004, pp. 1296-1300.

Ji, Xiang-Ying et al., "Micromechanics prediction of the effective elastic moduli of graphene sheet-reinforced polymer nanocomposites," Modelling and simulation in materials science and engineering, IOP Publishing Ltd, Bristol, GB, Jun. 1, 2010, vol. 18, No. 4, pp. 45005 (1)-45005 (16).

"Carbon Nanotube," Retreived from <http://en.wikipedia.org/wiki/Carbon_nanotube>, May 21, 2013, pp. 1-22.

"Graphene," Retreived by <http://en.wikipedia.org/wiki/Graphene>, May 21, 2013, pp. 1-19.

English translation of DE 102008001000 A1.

* cited by examiner

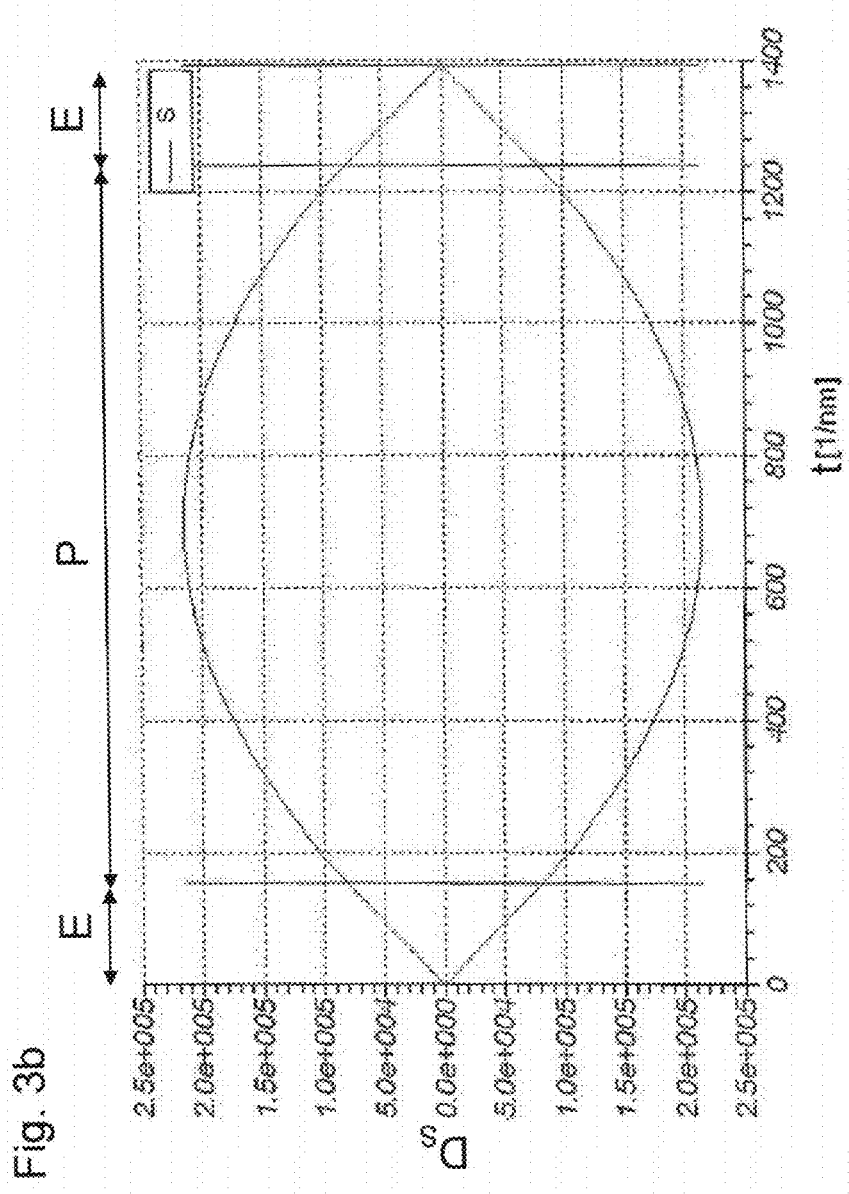

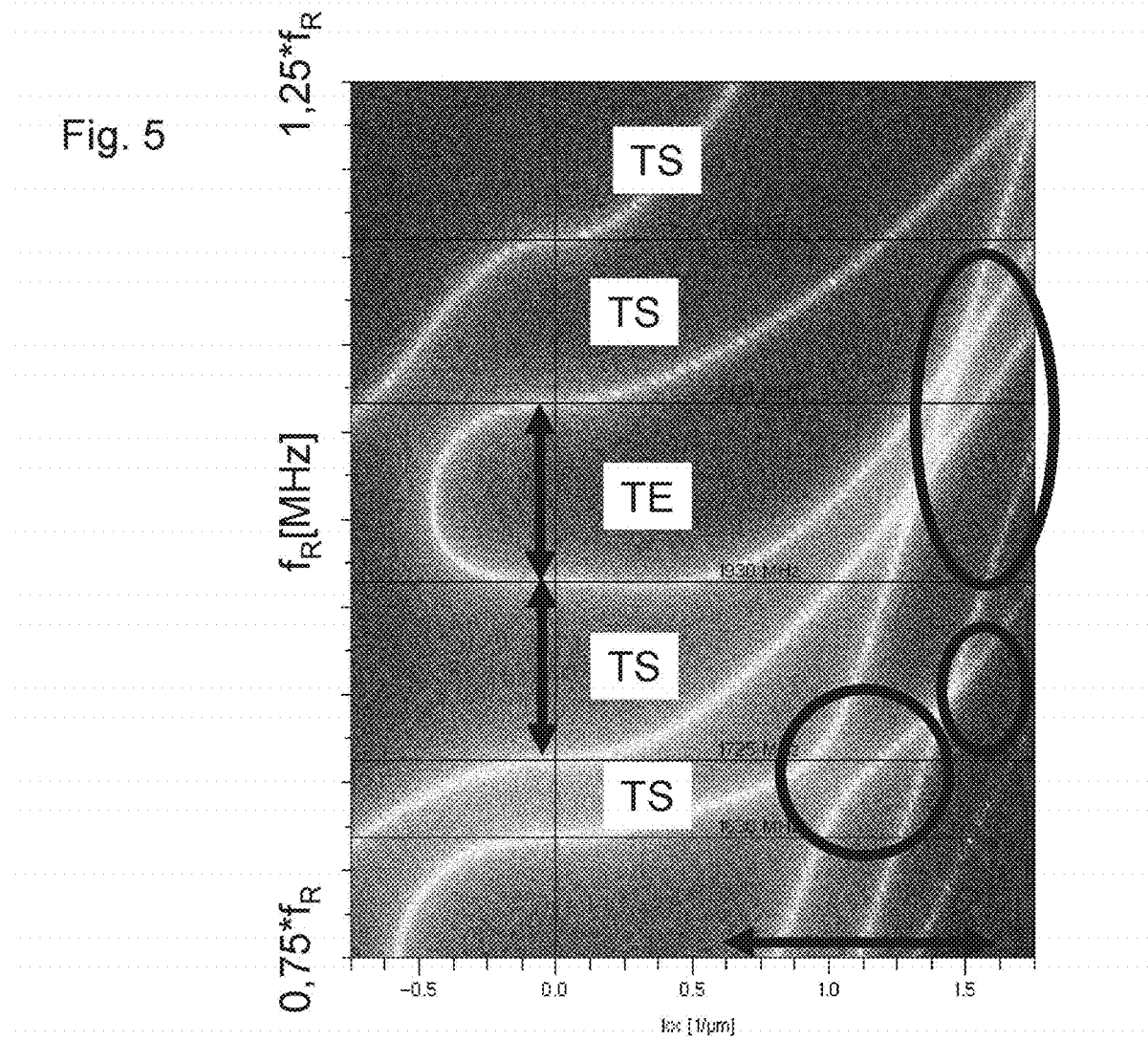

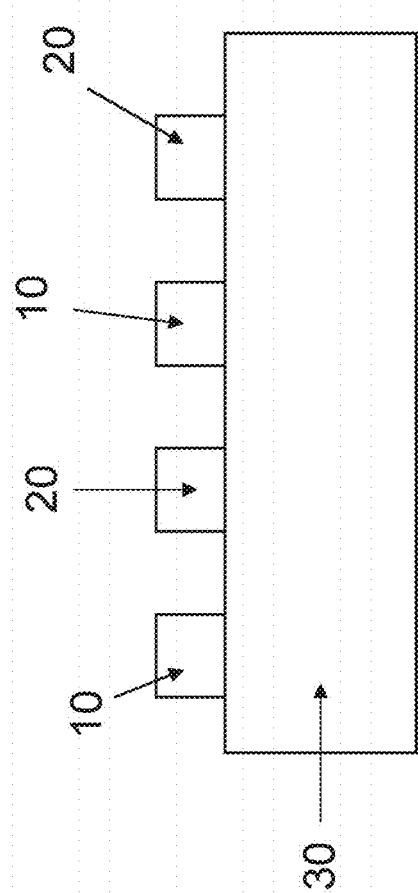

ELECTRONIC COMPONENT AND METHOD FOR PRODUCING THE ELECTRONIC COMPONENT

An electronic component is specified, as is a method for producing the electronic component.

An essential part of an electronic component, for example, of an electroacoustic component, is the electrode and, if appropriate, reflective layers. Many metallic materials have already been investigated as material for electrodes, for example molybdenum or tungsten.

It is an object of at least one embodiment of the invention to provide electronic components comprising a material having improved properties. This object is achieved by means of an electronic component according to claim 1. A further object of a further embodiment of the invention is to provide a method for producing such an electronic component. This object is achieved by means of a method according to claim 13. Dependent claims relate to further embodiments.

In accordance with one embodiment, an electronic component is specified which has a layer sequence, which comprises at least a first electrode, a second electrode, and an active region, which is electrically coupled to the first electrode and to the second electrode, and which layer sequence contains monoatomic carbon layers at least in partial regions. An electronic component is thus specified which contains a synthetic material, namely monoatomic carbon layers, at least in partial regions of its layer sequence.

In this context "electrically coupled" is understood to mean an ohmic or an electromagnetic contact.

"Layer sequence" can be understood to mean a plurality of layers arranged one above another, but also for example two layers arranged alongside one another on a third layer.

In accordance with one embodiment, the layer sequence of the electronic component can furthermore comprise reflective layers. Furthermore, the first electrode and/or the second electrode and/or a reflective layer can contain monoatomic carbon layers at least in partial regions.

In this case, at least one from the first electrode, the second electrode and a reflective layer contains monoatomic carbon layers at least in partial regions.

Therefore, an electronic component is specified which has at least one electrode and/or at least one reflective layer which contain monoatomic carbon layers, that is to say a synthesized material, completely or in partial regions.

Monoatomic carbon layers can comprise graphenes and hereinafter are designated at least partly as such.

Therefore, in one or both electrodes and/or in reflective layers of an electronic component, no heavy metal, such as molybdenum or tungsten, for example, is used, but rather an alternative, synthesized material.

The inventors have recognized that graphenes meet the stringent electrical and also acoustic requirements that can be made by an electronic component. This is because graphene has, in particular, mechanical stability and electrical conductivity. The mechanical stability can surpass that of steel, and the electrical conductivity that of copper.

Graphene is the designation for a monoatomically thin layer of $SP^2$-hybridized carbon. It can be synthesized in various ways. By way of example, individual graphene layers can be isolated by a procedure in which graphite is oxidized with oxygen, an oxygen atom is arranged at every second carbon atom and the individual graphite layers mutually repel one another as a result of the intercalated oxygen. A further synthesis method is to heat silicon carbide to 1500° C.

Graphene is a defined polycyclic aromatic hydrocarbon which can also be functionalized. Its basic structure is based on hexa-peri-hexabenzocoronene (HBC), which is insoluble in most solvents. This basic structure can be substituted by alkyl chains, for example, as a result of which the substituted graphene becomes soluble in solvents.

Both in crystalline form and in solution, graphene can be arranged in columnar fashion. In this case, aromatic cores can be arranged one directly above another. The columnar arrangement is referred to as self-assembly and forms depending on the substituents on the graphene, the temperature and the concentration, if the arrangement takes place in solution. As a result of the columnar arrangement in solution, it is possible to produce, for example, thin surface films having well-ordered layers—in the ideal case without defects—and a high charge carrier mobility.

The graphenes arranged in columnar fashion can be applied on a substrate, for example, in the so-called edge-on arrangement. In this case, the individual columns are arranged parallel to the substrate. Alternatively, the graphene can be arranged in its columnar arrangement in the so-called face-on orientation on a substrate. In this case the individual columns are arranged perpendicularly to the substrate. Both arrangements are distinguished by high order within the graphene layer.

The graphene, that is to say the monoatomic carbon layers, can be arranged as monolayers or as multilayers in the electronic component. Consequently, the carbon layers can be present as isolated layers or as layers arranged one above another, which can have high order in the electronic component, for example in the first or second electrode or a reflective layer.

The electronic component can be an electroacoustic component, wherein the active region comprises a piezoelectric layer. The piezoelectric layer can contain aluminum nitride, for example.

The first and second electrodes can be arranged on one side of the piezoelectric layer. Consequently, the electroacoustic component can be a surface-acoustic-wave-based component, for example. Alternatively the first and second electrodes can be arranged on mutually opposite sides of the piezoelectric layer. By way of example, a bulk-acoustic-wave-based component can be involved in this embodiment.

In order to be able to employ monoatomic carbon layers, that is to say graphene, as material for the first and/or second electrode and/or as a reflective layer in an electronic component, it has to fulfill specific requirements in respect of its acoustic properties, its electrical properties and its reaction to stress.

For an electrode, for example, the highest possible acoustic impedance is required if the electrode is used in an electroacoustic component. A good quality factor of the component can thus be obtained. Since graphene has a high acoustic impedance, it can be used as an electrode in electroacoustic components.

A good electrical conductivity is a further property which is required for the use of graphene, for example in electrodes of electronic components. The electrical conductivity of graphene can be $10^8$ S/m, which means that graphene has a higher conductivity than silver, for example, and can be used as electrode material.

A further factor in the selection of the electrode material is the ability to keep the stress produced in an electroacoustic component within the piezoelectric layer. The stress behavior or the stress distribution is of importance particularly for bulk-acoustic-wave-based components. Graphene here exhibits values comparable with previous electrode materials such as molybdenum or tungsten, for example.

In the electronic component, the first and/or the second electrode can comprise a plurality of layers arranged one above another, wherein at least one layer contains monoatomic carbon layers. The first and/or second electrode can thus be constructed completely from monoatomic carbon layers, or else have a sandwich structure composed of a layer containing monoatomic carbon layers and layers containing other materials.

The at least one layer of the first and/or second electrode which contains monoatomic carbon layers can be combined with at least one layer containing a material selected from a group comprising Ti, Mo, mixtures of Ti and Mo, Pt, Ru, W, Al, Cu and mixtures of Al and Cu.

By way of example, a sandwich structure can be formed which has the following construction: Ti, Al/Cu, W, wherein the monoatomic carbon containing layer can be arranged either between Ti and Al/Cu or between Al/Cu and W or on W.

A further possible sandwich structure has the following construction: Mo, Ti/Mo, Ru. Here, too, graphene can be arranged either between Mo and Ti/Mo or between Ti/Mo and Ru. Such a sandwich structure can constitute for example the electrode of a bulk-acoustic-wave-based component in which the piezoelectric layer is arranged on a substrate, and the first electrode is arranged between the substrate and the piezoelectric layer, and the second electrode is arranged on the piezoelectric layer on the side facing away from the substrate. In this case, the sandwich structure can form for example the first electrode of the component.

A further example of a sandwich structure is a monoatomic carbon layer in conjunction with an Al layer or an Al/Cu layer. Such an electrode can constitute, for example, the first and/or second electrode of a surface-acoustic-wave-based component in which both electrodes are arranged on one side of the piezoelectric layer.

The two electrodes of a surface-acoustic-wave-based component can have a so-called comb structure in which fingers of the comb of the first and second electrodes are arranged alternately successively on the piezoelectric substrate. In this case, field lines can form between the respective first and second electrodes.

In the case of the surface-acoustic-wave-based component, the mechanical stability of the graphene is particularly advantageous for the use thereof as material for the electrodes. In the case of a bulk-acoustic-wave-based component, the high electrical conductivity and the well-definable layer thickness of a graphene layer are advantageous for use as an electrode. In both cases, the properties of the components can be improved by the use of graphene as electrode material. Furthermore, the component size can also be reduced since, as a result of the increased conductivity and/or increased mechanical stability, the layer thicknesses of all further electrode materials used can be reduced.

An electronic component can furthermore comprise at least one first reflective layer having a high acoustic impedance and at least one second reflective layer having a low acoustic impedance and a substrate, wherein the first reflective layer and the second reflective layer are arranged between the substrate and the first electrode. It is also possible for two first and two second reflective layers to be arranged alternately, one above another. Thus, by way of example, a Bragg mirror can be formed between the substrate and the piezoelectric layer, which mirror ensures that waves generated in the piezoelectric layer cannot escape through the substrate. The first and second reflective layers can be λ/4 mirror layers.

At least one first reflective layer can contain W. The first reflective layer can be electrically conductive.

At least one second reflective layer can have chemically modified monoatomic carbon layers. By way of example, graphene provided with oxygen can be used, which has insulating properties. The second reflective layer can be electrically insulating.

Consequently, graphene can also be used as nonconductive material as part of a Bragg mirror in an electronic component, for example a bulk-acoustic-wave-based component. The second reflective layer, containing monoatomic carbon layers, can be arranged between the first reflective layer and the first electrode. Graphene is thus used as an insulator, as a result of which structurings required hitherto for avoiding short circuits are obviated and the construction of a layer stack can be simplified in terms of process engineering.

Graphene can therefore be realized either as an insulator or as an electrical conductor. The addition of oxygen in order to obtain an insulator can occur without the mechanical properties being impaired.

The electronic component can be embodied as a surface-acoustic-wave-based component, as a bulk-acoustic-wave-based component or as a microelectromechanical component. A surface-acoustic-wave-based component can also be designated as SAW component (SAW: surface acoustic wave). A bulk-acoustic-wave-based component can also be designated as BAW component (BAW: bulk acoustic wave).

It is therefore possible to provide for example SAW or BAW filters, resonators or sensors and also waveguides or delay lines with the electronic component. Furthermore, the electronic component can constitute a so-called guide bulk-acoustic-wave-based component. Furthermore, filters can be used to construct duplexers and to produce further complex modules. Such electroacoustic components can be used in mobile radio, for example.

Consequently, graphene, depending on its electrical property, can be used as electrode material and/or as reflective layer in, for example, an electroacoustic component.

Furthermore, a method for producing an electronic component according to one of the preceding embodiments is specified. In this case, the monoatomic carbon layers can be applied by means of a method selected from a group comprising chemical vapor deposition, physical vapor deposition, application in solution and chemical surface reactions. Thus, a diverse method is provided by which graphene layers can be applied at the desired location of an electronic component in an uncomplicated manner.

The invention will be explained in greater detail with reference to the figures and exemplary embodiments.

Figure 2:
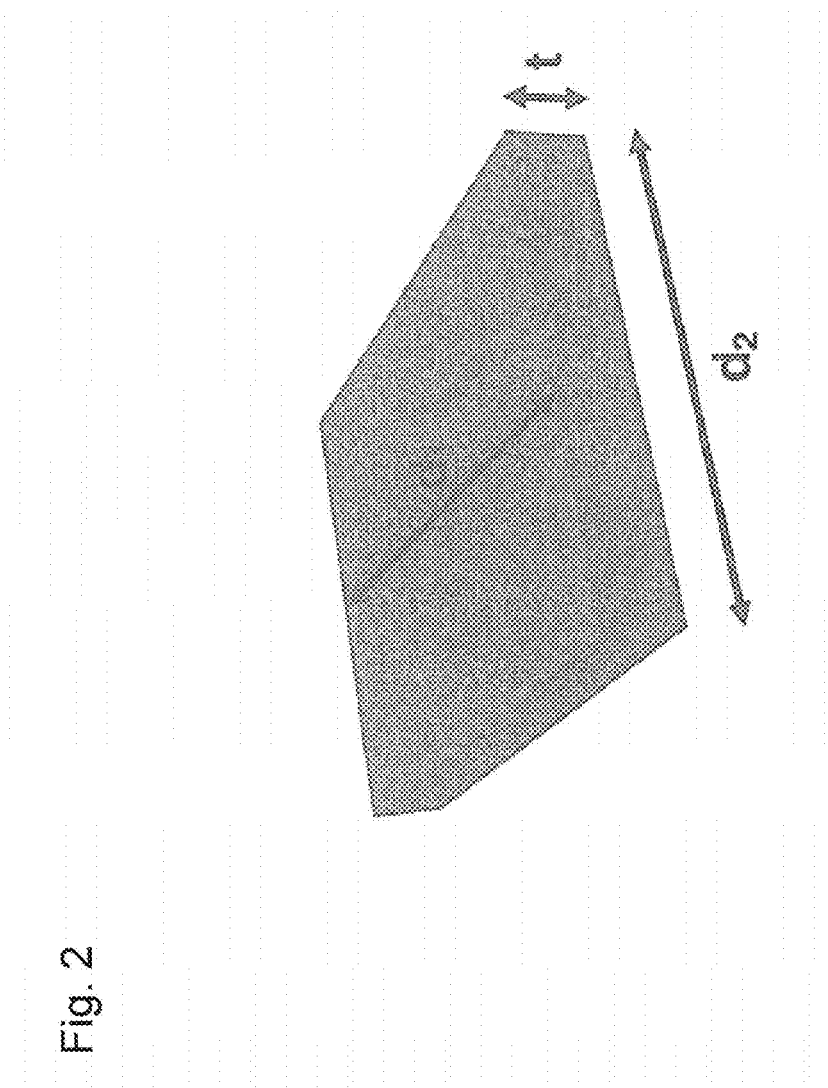
Figure 3A:
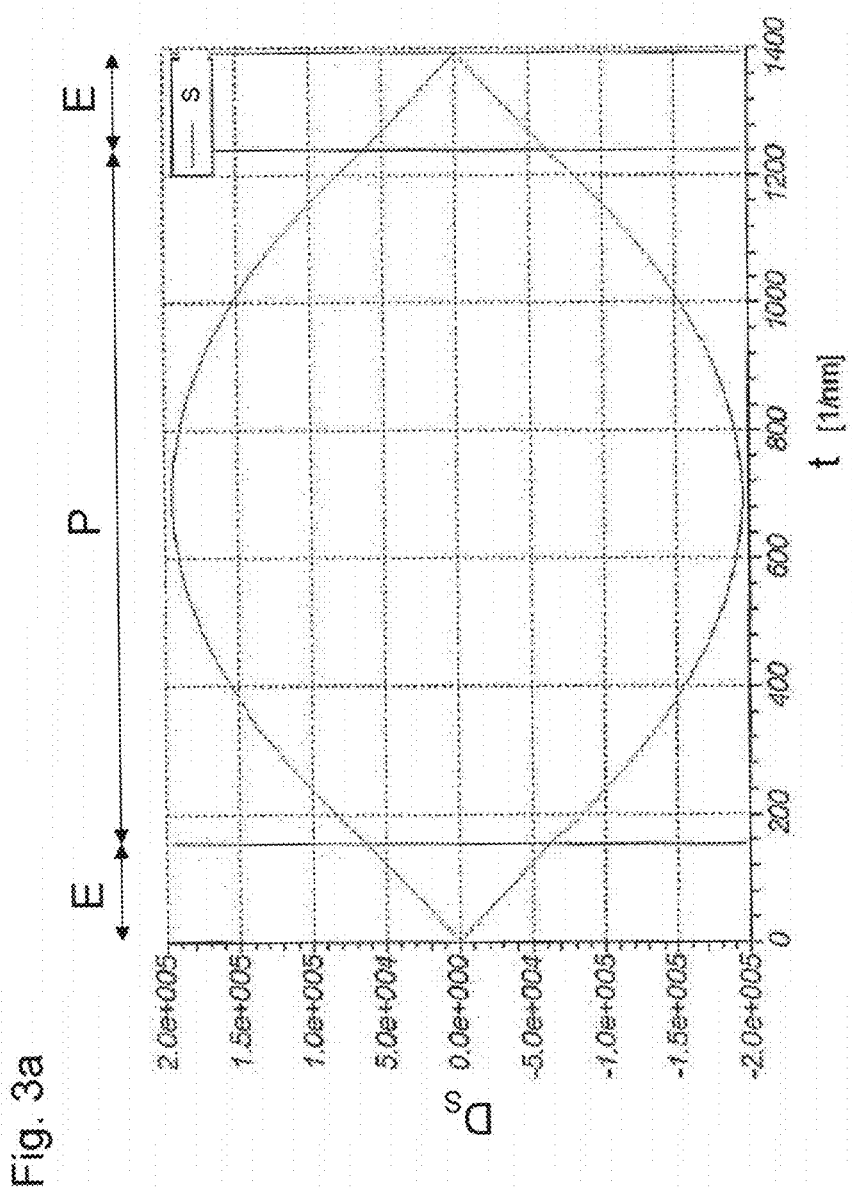
Figure 4:
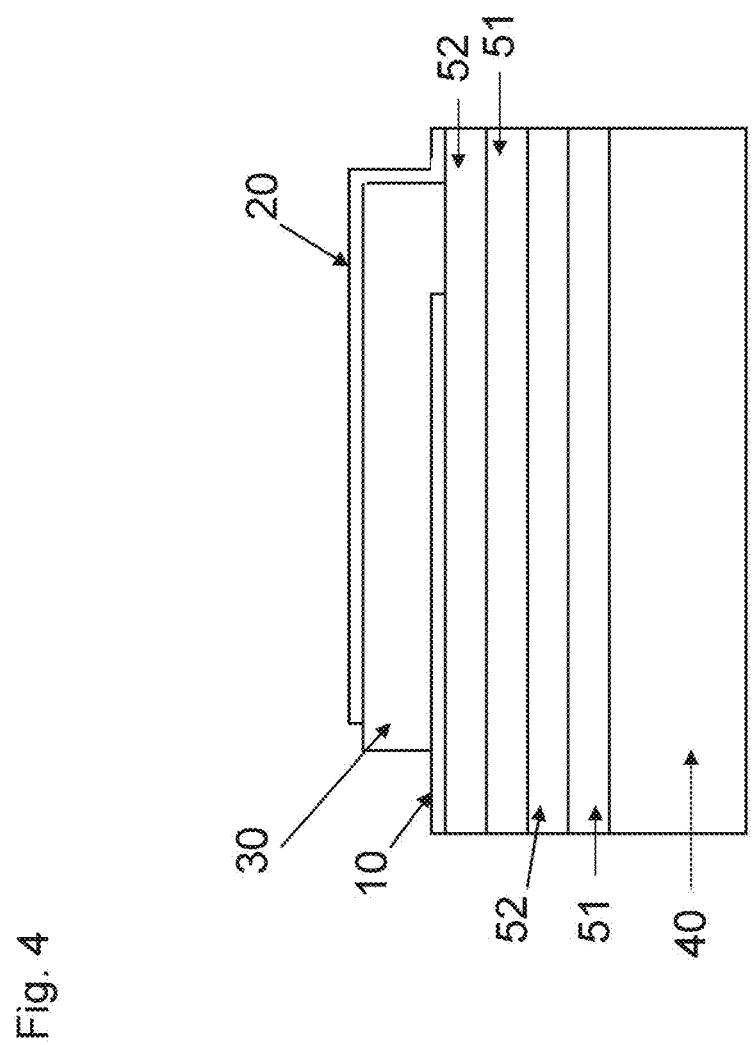
Figure 6B:
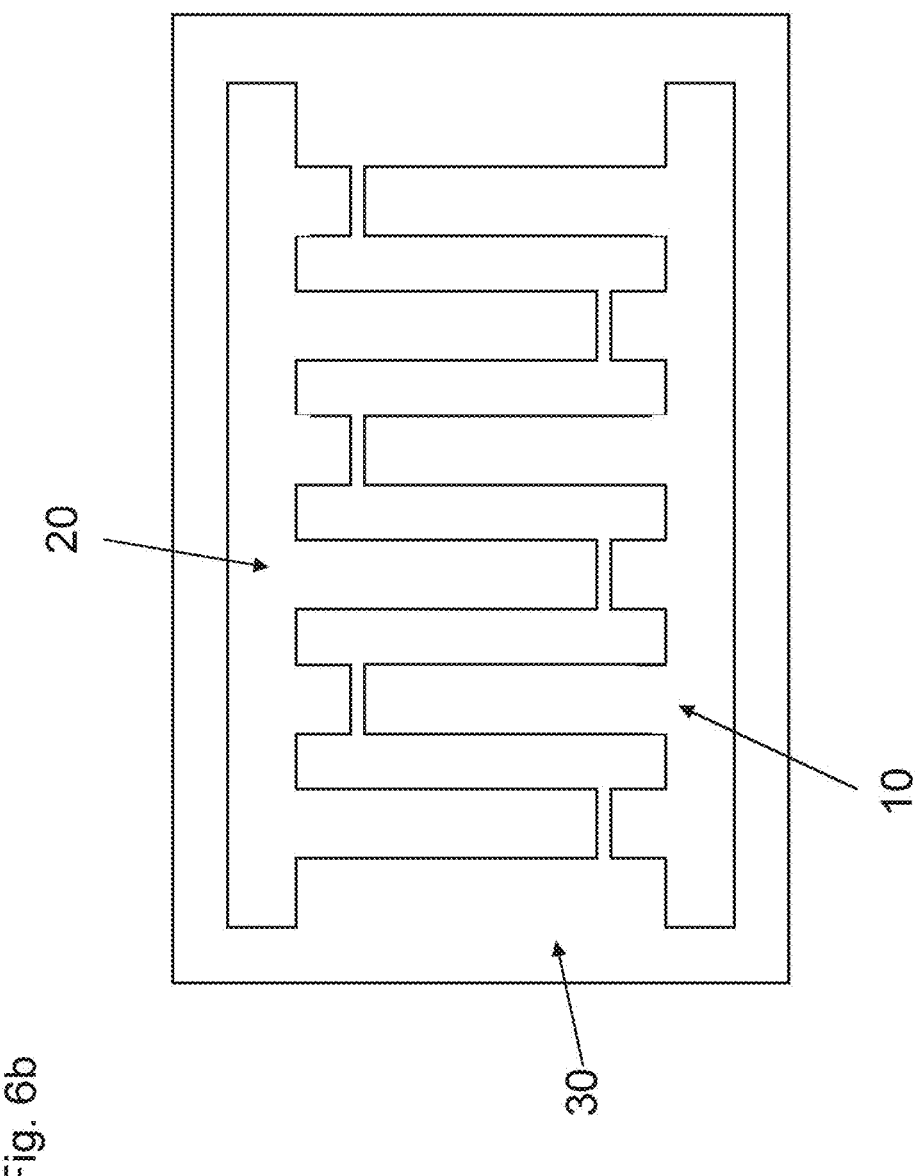

FIG. 1 shows a graphical illustration of the acoustic impedance of graphene in comparison with other materials, FIG. 2 shows a three-dimensional schematic side view of an electrode, FIGS. 3a) to c) show the stress distribution of different layer sequences, FIG. 4 shows the schematic side view of a bulk-acoustic-wave-based electroacoustic component, FIG. 5 shows the dispersion curve of a component, FIG. 6a shows the schematic side view of a surface-acoustic-wave-based electroacoustic component, FIG. 6b shows the schematic plan view of a surface-acoustic-wave-based electroacoustic component.

FIG. 1 shows the graphical illustration of the acoustic impedance of various materials.

For the acoustic properties, consideration should be given to what is known as Young's modulus Y (the modulus of elasticity), which for graphene is between 0.5 and 1.2 TPa, the density ρ, which for graphene is approximately between 3000 to 4000 kg/m³, and the Poisson ratio ν, which for graphene is between 0.04 and 0.11. From these variables, it is possible to estimate acoustic parameters which, together with the manner of graphene production, yield the exact acoustic parameters. If extreme values are assumed and an isotropic material is presupposed, estimated values can be obtained if the relationships of the so-called compliance matrix $$c_{11} = Y \frac{(1-\upsilon)}{(1+\upsilon)(1-2\upsilon)}$$

$$c_{12} = Y \frac{\upsilon}{(1+\upsilon)(1-2\upsilon)}$$

$$c_{44} = Y \frac{1}{2(1+\upsilon)}$$

are evaluated. From these parameters, it is possible to derive acoustic reference parameters that are defined as follows:

Acoustic impedance (longitudinal):

$$Z = \sqrt{\rho c_{11}} = \rho v_L$$

Acoustic impedance (shear):

$$Z_s = \sqrt{\rho \frac{1}{2}[c_{11}-c_{12}]} = \rho \cdot v_s$$

In this case, $v_L$ and $v_s$ are the longitudinal and the shear velocity, respectively. Corresponding propagation velocities can be derived from these impedances.

The velocity in km/s is indicated on the x-axis in FIG. 1, and the density in g/cm³ on the y-axis. The size of each bubble represents the acoustic impedance of the respective material. The bubble identified by G in this case stands for the acoustic impedance of graphene. The size of this bubble is compared with some conventional materials for electrodes of electroacoustic components, for example Pt, W, U or Mo.

For a bulk-acoustic-wave-based component, for example, the acoustic impedance of the electrode has to be very high in order to obtain the best possible quality factor. In FIG. 1, in which the acoustic impedance is indicated by the bubble radius, a suitable material can thus be chosen according to the largest possible bubble radius. In this case, graphene is of the order of magnitude of molybdenum and uranium. It can therefore be used whilst maintaining or improving the quality factor of an electrode and can in this case replace or supplement molybdenum or tungsten if an electrode has a plurality of layers, and at least one of these layers comprises graphene.

The shear wave of various materials could also be represented in a similar manner (not shown here). Such a graphic diagram could also reveal that synthetic graphene is a good replacement for molybdenum or tungsten.

FIG. 2 shows the schematic three-dimensional view of an electrode in the form of a parallelepiped, in which the dimensions of the electrode $d_1$, $d_2$ and t are illustrated. In this case $d_1$ denotes the length of the electrode, $d_2$ denotes the width of the electrode and t denotes the thickness of the electrode.

The electrical resistance R can be calculated on the basis of the geometrical structure of an electronic component, for example of a bulk-acoustic-wave-based component. The electrical resistance can be determined on the basis of the relationship $$R = \frac{l}{\kappa_{el} A} = \frac{d_1}{\kappa_{el} d_2 t}$$

In this case, $\kappa_{el}$ is the electrical conductivity, A is the area of, for example, an electrode, $d_1 = l$ is the length, $d_2$ is the width and t is the thickness. The electrical conductivity of graphene can be $10^8$ S/m, for example, which means that graphene has a higher conductivity than silver, for example. Given an electrode thickness t of 200 μm and an area A of 200 μm×200 μm, the following resistance values arise for selected materials, for example:

| Material | Resistance |
| --- | --- |
| Pt | 0.5263158 |
| Ru | 0.3649635 |
| W | 0.2747253 |
| Mo | 0.2702703 |
| Ir | 0.2304147 |
| Al | 0.1351351 |
| Au | 0.1063830 |
| Cu | 0.0847458 |
| Graphene | 0.05 |

It can be gathered from this that graphene can also be used as electrode material in electroacoustic components on account of its electrical properties.

Figure 3C:
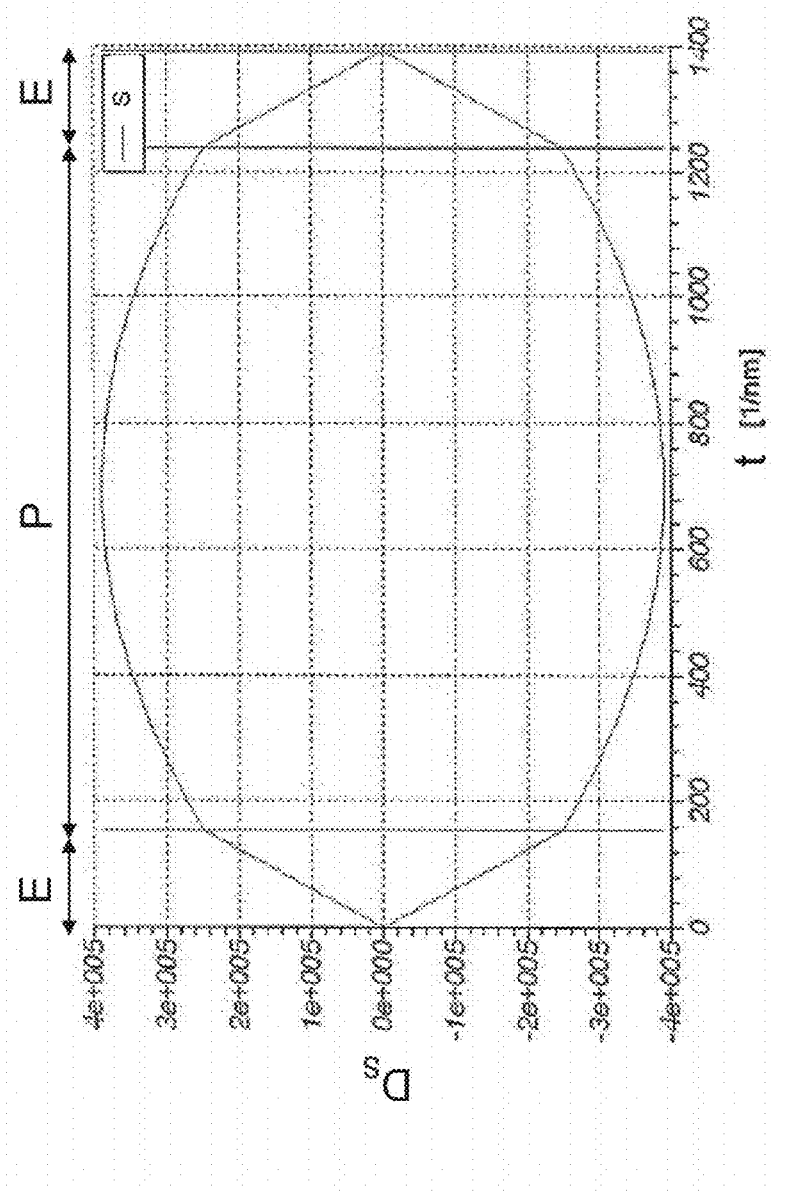

FIGS. 3a to 3c show a graphical representation of the stress distribution in different layer sequences. Here the reciprocal of the layer thickness t in 1:nm is respectively indicated on the x-axis, and the stress distribution $D_S$ on the y-axis. In FIGS. 3a to c, the region of the electrodes E and the region of the piezoelectric layer P are indicated above the upper x-axis. The lines illustrated represent the stress S. The ability to keep the stress produced in an electroacoustic component within the piezoelectric layer is of importance particularly for bulk-acoustic-wave-based components. Here, graphene exhibits values comparable to previous electrode materials such as molybdenum or tungsten for example.

FIG. 3a illustrates the stress distribution of the layer sequence AlCu, AlN, AlCu. AlCu is respectively the first and the second electrode and AlN is the piezoelectric layer. In FIG. 3b, the two electrodes are replaced by graphene. In FIG. 3c, the two electrodes are replaced by molybdenum Mo.

Comparison of the three FIGS. 3a to 3c shows that with the use of graphene as electrode material the stress distribution is slightly smaller than with the use of AlCu or Mo electrodes. Since the density of graphene is approximately in the range of the density of AlN, the stress behavior of the graphene-AlN-graphene sandwich is also very similar to the stress behavior of the AlCu—AlN—AlCu sandwich. Consequently, with regard also to its ability to keep the produced stress within the piezoelectric layer, graphene can replace or supplement conventional electrode material.

FIG. 4 shows the schematic side view of a bulk-acoustic-wave-based electroacoustic component. The latter comprises a substrate 40, in each case two first reflective layers 51 and second reflective layers 52, a first electrode 10, a second electrode 20 and a piezoelectric layer 30. The reflective layers constitute Bragg mirrors, wherein the first reflective layer 51 has a high acoustic impedance and the second reflective layer has a low acoustic impedance. A high acoustic impedance can be associated with a high electrical conductivity, while a low acoustic impedance can often be associated with an insulating property of the material.

The first reflective layer 51 can contain tungsten, for example, and the second reflective layer 52 can contain $SiO_2$, for example. The second reflective layer can alternatively contain graphene if the latter was treated for example with oxygen such that it has insulating properties.

Reflective layers arranged in this way have a high reflectivity both for longitudinal waves and for shear waves. Therefore, these waves can be reflected so as to be guided back into the piezoelectric layer.

The substrate 40 can comprise Si or $SiO_2$, for example. The actual resonator is situated on the reflective layers and comprises the first electrode 10, the second electrode 20 and the piezoelectric layer 30. The piezoelectric layer can contain AlN, for example, and the two electrodes can comprise metals such as Ti, Mo, mixtures of Ti and Mo, Ru, Pt, W, Al, Cu and mixtures of Al and Cu. The electrodes can also contain a plurality of partial layers stacked one above another, wherein each partial layer contains a different material that can be selected from those enumerated above. In this case, one of said partial layers can be graphene. This can be the case either in the first or in the second electrode 10, 20 or else in both. Both electrodes 10, 20 can also be formed completely from graphene.

By way of example, an electrode can have the sandwich structure Ti, Al/Cu, W wherein the graphene-containing layer can be arranged either between Ti and Al/Cu or between Al/Cu and W or on W.

A further possible sandwich structure has the construction Mo, Ti/Mo, Ru, wherein graphene is arranged either between Mo and Ti/Mo or between Ti/Mo and Ru.

On the layer stack such as is shown in FIG. 4, furthermore, a terminating oxide layer can be applied as passivation (not shown here).

The layer sequence comprising reflective layers 51, 52 can be dimensioned so as to result in a flat dispersion.

FIG. 5 shows the dispersion curve $f_R(kx)$ of an electroacoustic bulk-acoustic-wave-based component, for example of a resonator. In this case, the frequency $f_R$ in MHz is plotted against the wave number kx in 1/µm. The dispersion curve has a vanishing gradient at kx=0. The dispersion should always be chosen such that it is monotonically increasing or very flat. A flat or monotonically increasing dispersion means a low energy loss from the acoustic wave. The horizontal double-headed arrow in FIG. 5 shows a kx range for monotonic gradient. The vertical double-headed arrows show the intervals between the modes TE (thickness extensional) and TS (thickness shear). The circles show branch points in the dispersion curve.

Dispersion curves describe the relation between the angular frequency or the frequency of bulk acoustic waves on the one hand and the wave vector or the wave number of the bulk acoustic waves, on the other hand. Different branches in the frequency-wave vector diagram in this case indicate different oscillation modes of the resonator. Acoustic losses can be minimized if the intervals between modes of different types in the vicinity of the longitudinal main mode are chosen to be as large as possible.

FIG. 6a shows the schematic side view of a surface-acoustic-wave-based component. The latter comprises the piezoelectric layer 30, a first electrode 10 and a second electrode 20. FIG. 6b shows such a component in a schematic plan view. With the aid of this figure it is evident that the first electrode 10 and the second electrode 20 each have a comb-like structure, wherein each comb alternately has a short and a long finger. The fingers of the different combs are arranged alternately successively on the piezoelectric layer along the longitudinal axis of the piezoelectric layer 30. This is also evident in the schematic side view in FIG. 6a. Consequently, electromagnetic waves form between the individual fingers of the electrodes 10, 20, which waves can be converted into mechanical waves by the piezoelectric layer, and vice versa.

At least one of the two electrodes 10 and 20 is formed from graphene. In this case, the electrode can be formed completely from graphene or have a layer sequence composed of layers stacked one above another, wherein at least one of said layers contains graphene as material. By way of example, one or both electrodes can have a sandwich structure having a monoatomic carbon layer in conjunction with an Al layer or an Al/Cu layer.

On account of its high mechanical stability and good electrical conductivity, it is thereby possible to improve the performance of a component with a graphene-containing electrode.

Housing structures, which can have a cavity, can furthermore be applied (not shown here) over the components such as are illustrated schematically in FIGS. 4 and 6.

The invention is not restricted by the description on the basis of exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

10 First electrode
20 Second electrode
30 Piezoelectric layer
40 Substrate
51 First reflective layer
52 Second reflective layer
t Thickness
$D_S$ Stress distribution
$d_1$ Length
$d_2$ Width
v Velocity
D Density
E Region of the electrodes
P Region of the piezoelectric layer
$f_R$ Frequency
kx Wave number
TE Mode
TS Mode

The invention claimed is:
1. An electroacoustic component having a layer sequence, the layer sequence comprising:
  a first electrode;
  a second electrode; and
  an active region, which is electrically coupled to the first electrode and the second electrode,
    wherein the layer sequence includes graphene at least in partial regions,
    wherein the graphene is arranged as monolayers or as multilayers, and
    wherein the active region comprises a piezoelectric layer.

2. The electroacoustic component according to claim 1, wherein the layer sequence further comprises reflective layers.

3. The electroacoustic component according to claim 1 or 2, wherein the first electrode or the second electrode or a reflective layer contains monoatomic carbon layers at least in partial regions.

4. The electroacoustic component according to claim 1, wherein the first and second electrodes are arranged on one side of the piezoelectric layer or on mutually opposite sides of the piezoelectric layer.

5. The electroacoustic component according to claim 4, wherein the first or the second electrode comprises a plurality of layers arranged one above another, at least one layer of which contains monoatomic carbon layers.

6. The electroacoustic component according to claim 5, wherein the at least one layer of the first or second electrode which contains monoatomic carbon layers is combined with at least one layer containing a material selected from a group comprising Ti, Mo, mixtures of Ti and Mo, Ru, Pt, W, Al, Cu and mixtures of Al and Cu.

7. The electroacoustic component according to claim 2, further comprising:
at least one first reflective layer having a high acoustic impedance;
at least one second reflective layer having a low acoustic impedance; and
a substrate, wherein the at least one first reflective layer and the at least one second reflective layer are arranged between the substrate and the first electrode.

8. The electroacoustic component according to claim 7, wherein the at least one second reflective layer has chemically modified monoatomic carbon layers.

9. The electroacoustic component according to claim 8, wherein the at least one second reflective layer is electrically insulating.

10. The electroacoustic component according to one of claims 7 to 9, wherein the at least one first reflective layer contains W.

11. The electroacoustic component according to claim 7, wherein the at least one second reflective layer is arranged between the at least one first reflective layer and the first electrode.

12. The electroacoustic component according to claim 11, which is embodied as a surface-acoustic-wave-based component, as a bulk-acoustic-wave-based component or as a microelectro-mechanical component.

13. A method for producing an electroacoustic component according to claim 1, wherein the graphene is applied by means of a method selected from a group comprising chemical vapor deposition, physical vapor deposition, application in solution and chemical surface reactions.

* * * * *